(12) United States Patent
Sugimoto et al.

(10) Patent No.: US 9,872,388 B2
(45) Date of Patent: Jan. 16, 2018

(54) PRINTED WIRING BOARD

(71) Applicant: FANUC Corporation, Yamanashi (JP)

(72) Inventors: Nobuhisa Sugimoto, Yamanashi (JP); Takeshi Sawada, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 40 days.

(21) Appl. No.: 14/630,048

(22) Filed: Feb. 24, 2015

(65) Prior Publication Data

US 2015/0245482 A1 Aug. 27, 2015

(30) Foreign Application Priority Data

Feb. 25, 2014 (JP) ................. 2014-034505

(51) Int. Cl.
| | |
|---|---|
| H05K 7/10 | (2006.01) |
| H05K 7/12 | (2006.01) |
| H05K 1/11 | (2006.01) |
| H05K 1/18 | (2006.01) |
| H05K 3/34 | (2006.01) |

(52) U.S. Cl.
CPC ............ *H05K 1/111* (2013.01); *H05K 1/181* (2013.01); *H05K 3/3421* (2013.01); *H05K 3/3442* (2013.01); *H05K 2201/09381* (2013.01); *Y02P 70/611* (2015.11)

(58) Field of Classification Search
CPC ........ H05K 1/111; H05K 1/141–1/144; H05K 3/429; H05K 3/3452; H05K 2201/10734; H01L 2924/01078–2924/01079; H01L 2924/14; H01L 2924/16

USPC ............ 361/767–774; 174/259–264
See application file for complete search history.

(56) References Cited

U.S. PATENT DOCUMENTS

| | | | |
|---|---|---|---|
| 5,067,042 A | 11/1991 | Nagano | |
| 5,457,878 A | 10/1995 | Rostoker et al. | |
| 7,298,629 B2 * | 11/2007 | Nakajima | H05K 1/111 174/262 |
| 8,184,444 B2 * | 5/2012 | Lee | H05K 1/111 257/720 |
| 2003/0235043 A1 | 12/2003 | Yoshida | |
| 2008/0006918 A1 | 1/2008 | Nagatanini | |

(Continued)

FOREIGN PATENT DOCUMENTS

| | | |
|---|---|---|
| CN | 101102662 A | 1/2008 |
| CN | 101378630 A | 3/2009 |

(Continued)

OTHER PUBLICATIONS

Office Action dated May 12, 2015, corresponding to Japanese patent application No. 2014-034505.

(Continued)

*Primary Examiner* — Tuan T Dinh
(74) *Attorney, Agent, or Firm* — Hauptman Ham, LLP

(57) ABSTRACT

In a printed wiring board on which an electronic component comprising electrode terminal rows on four peripheral sides or two opposite sides thereof is mounted, each of pads at the both ends of pad rows corresponding to the electrode terminal rows extend outwardly relative to the other pads in the direction of arrangement of the pads and has a shape obtained by diagonally cutting a corner located farthest from the center of the electronic component.

6 Claims, 4 Drawing Sheets

(56) References Cited

U.S. PATENT DOCUMENTS

| | | | |
|---|---|---|---|
| 2008/0266824 A1* | 10/2008 | Wang | H05K 1/111 |
| | | | 361/767 |
| 2009/0056985 A1 | 3/2009 | Hirano et al. | |
| 2013/0140714 A1 | 6/2013 | Numazaki | |
| 2014/0014969 A1 | 1/2014 | Kunii et al. | |

FOREIGN PATENT DOCUMENTS

| | | |
|---|---|---|
| CN | 202352659 U | 7/2012 |
| CN | 103137592 A | 6/2013 |
| CN | 103545281 A | 1/2014 |
| JP | 61-157369 U | 9/1986 |
| JP | 63-20471 U | 2/1988 |
| JP | 63-64079 U | 4/1988 |
| JP | 63-142894 A | 6/1988 |
| JP | 4-250305 A | 9/1992 |
| JP | 5-94958 U | 12/1993 |
| JP | 6-7272 U | 1/1994 |
| JP | 6-169153 A | 6/1994 |
| JP | H07-183650 A | 7/1995 |
| JP | 2004-23076 A | 1/2004 |
| JP | 2005-26312 A | 1/2005 |
| JP | 2005-223091 A | 8/2005 |
| JP | 2010-278133 A | 12/2010 |

OTHER PUBLICATIONS

Decision to Grant a Patent in JP Application No. 2014-034505, dated Mar. 1, 2016.
Office Action in CN Application No. 201510085137.6, dated Mar. 10, 2017.

* cited by examiner (NORMAL)

(OUTERMOST PADS EXTENDED)

(OUTERMOST PADS EXTENDED AND CUT AT CORNER)

PRINTED WIRING BOARD

RELATED APPLICATIONS

The present application claims priority to Japanese Application Number 2014-034505, filed Feb. 25, 2014, the disclosure of which is hereby incorporated by reference herein in its entirety.

BACKGROUND OF THE INVENTION

Field of the Invention

The present invention relates to a printed wiring board on which electronic components are mounted.

Description of the Related Art

Conventionally, an electronic component 3 is mounted on pads 7 of a printed wiring board 1 in the following manner. As shown in FIG. 6, the rectangular pads 7 are arranged on the printed wiring board 1, depending on the shape, size, layout, etc., of electrode terminals 5 of the electronic component 3. A solder paste is applied to the pads 7 and the electronic component 3 is placed on the paste. The entire structure is heated by a reflow device. The electronic component 3 is mounted on the pads 7 as the solder paste is melted so that the electrode terminals 5 of the electronic component 3 are soldered to the pads 7 of the printed wiring board 1. In FIG. 6, numerals 2, 4 and 6 designate a mounting area, the body, and wiring, respectively. Japanese Patent Application Laid-Open No. 7-183650 relates to this technique.

The conventional technique shown in FIG. 6 has a problem that a large stress is applied to soldered portions of those pads 7 which are located at the both ends of pad rows during a temperature cycle so that surrounding elements are liable to fail due to rupture of the soldered portions.

SUMMARY OF THE INVENTION

Accordingly, the object of the present invention is to provide a printed wiring board configured so that the rupture life of soldered portions of pads thereon can be extended.

According to the present invention, each of pads at the both ends of pad rows that are most heavily stressed during a temperature cycle comprises an extension extending outwardly in the direction of arrangement of the pads from the center of an electronic component, the extension having a shape obtained by diagonally cutting a corner of the pad located farthest from the center of the electronic component.

A printed wiring board according to the present invention is mounted with an electronic component comprising electrode terminal rows on four peripheral sides or two opposite sides thereof. The printed wiring board comprises pad rows corresponding to the electrode terminal rows and each of pads at the both ends of the pad rows comprises an extension extending outwardly relative to the other pads in the direction of arrangement of the pads from the center of the electronic component, the extension having a shape obtained by diagonally cutting a corner located farthest from the center of the electronic component.

Each of the pads at the both ends may have a shape obtained by diagonally cutting the end pad by a segment which connects the points of intersection of two sides between which the corner farthest from the center of the electronic component is located and perpendicular lines extending from the corner to the two sides.

Each of the pads at the both ends may comprise an extension extending outwardly in a direction perpendicular to the direction of arrangement of the pads, as well as in the direction of arrangement of the pads, from the center of the electronic component.

According to the present invention configured as described above, there can be provided a printed wiring board configured so that the rupture life of soldered portions of pads thereon can be extended.

BRIEF DESCRIPTION OF THE DRAWINGS

The above and other objects and features of the present invention will be obvious from the ensuing description of embodiments with reference to the accompanying drawings, in which.

DETAILED DESCRIPTION OF THE PREFERRED EMBODIMENTS

Figure 1:
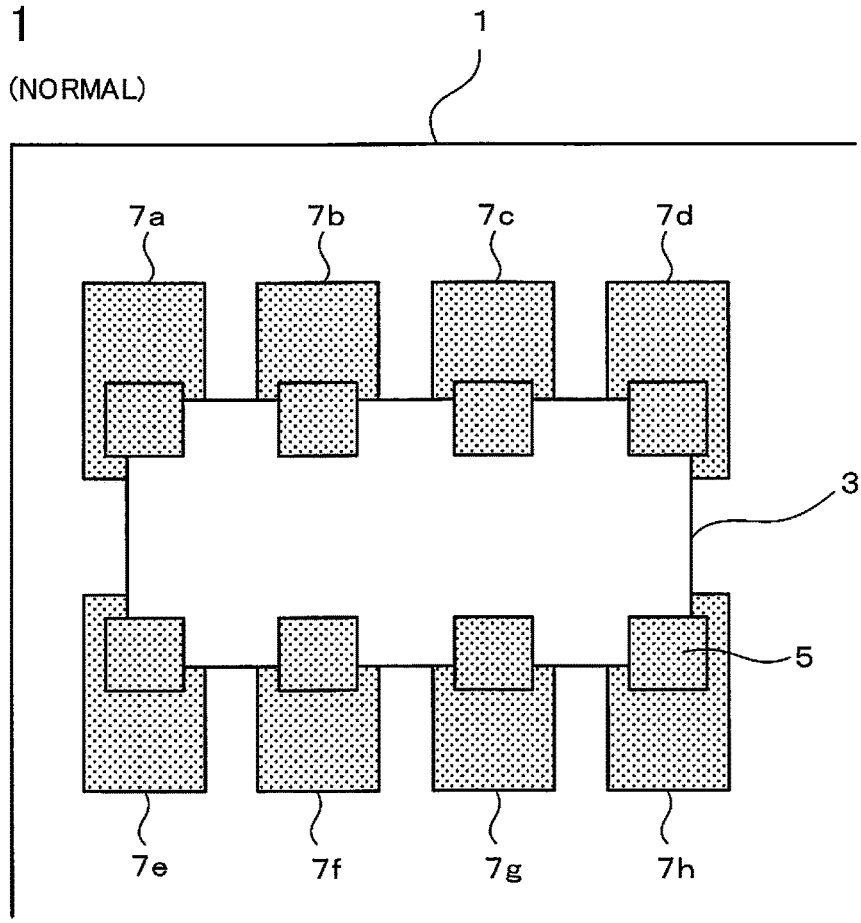
FIG. 1 is a view showing how an electronic component is placed on pads of a printed wiring board.

FIG. 1 is a view showing how an electronic component is placed on pads of a printed wiring board. In the present embodiment, each pad is rectangular. A printed wiring board 1 is provided with pads 7 on which an electronic component 3 is mounted. The electronic component 3 is, for example, an electronic component provided with a plurality of electrode terminals 5. Four electrode terminals 5 are arranged side by side on each of two opposite sides of the electronic component 3. In the present embodiment, the electrode terminals 5 are arrayed on four peripheral sides or two opposite sides of the electronic component 3. The electrode terminals 5 of the electronic component 3 and the pads 7 on the printed wiring board 1 are electrically connected and secured to one another by soldering.

Figure 2:
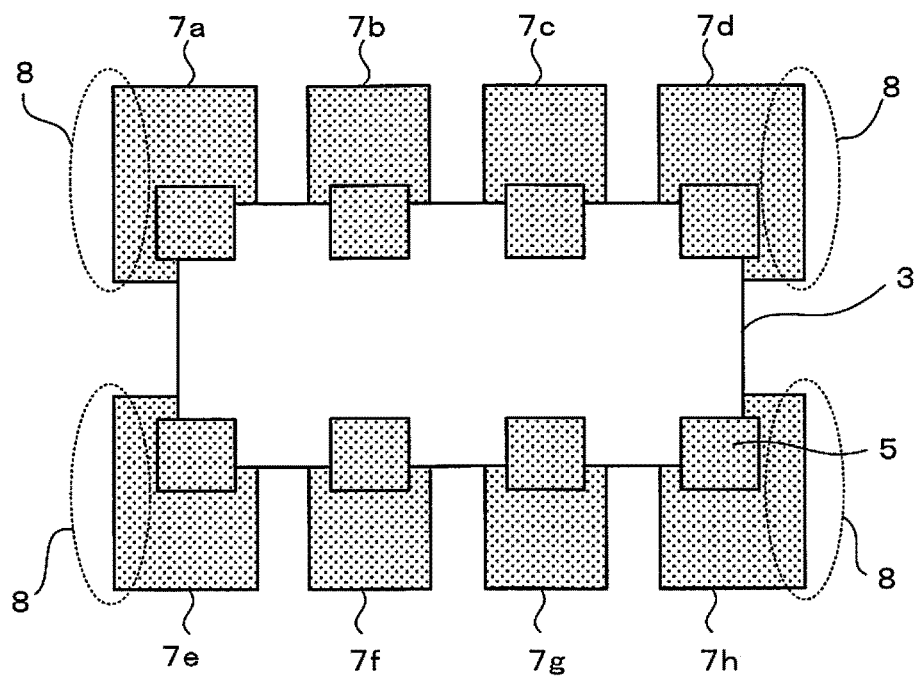
FIG. 2 is a view showing how outermost pads of FIG. 1 are extended.

FIG. 2 is a view showing how the outermost pads of FIG. 1 are extended. The four outermost ones of the pads (7a, 7b, 7c, 7d, 7e, 7f, 7g and 7h) are designated by 7a, 7d, 7e and 7h, individually. The outermost pads 7a, 7d, 7e and 7h are located individually at the both ends of pad rows corresponding to the rows of the electrode terminals 5 of the electronic component 3.

These pads 7a, 7d, 7e and 7h are extended outwardly relative to the other pads in the direction of their arrangement. Thus, each of the outermost pads has an extension (designated by numeral 8 in FIG. 2), which extends outwardly in the direction of arrangement of the pads from the center of the electronic component.

Figure 3:
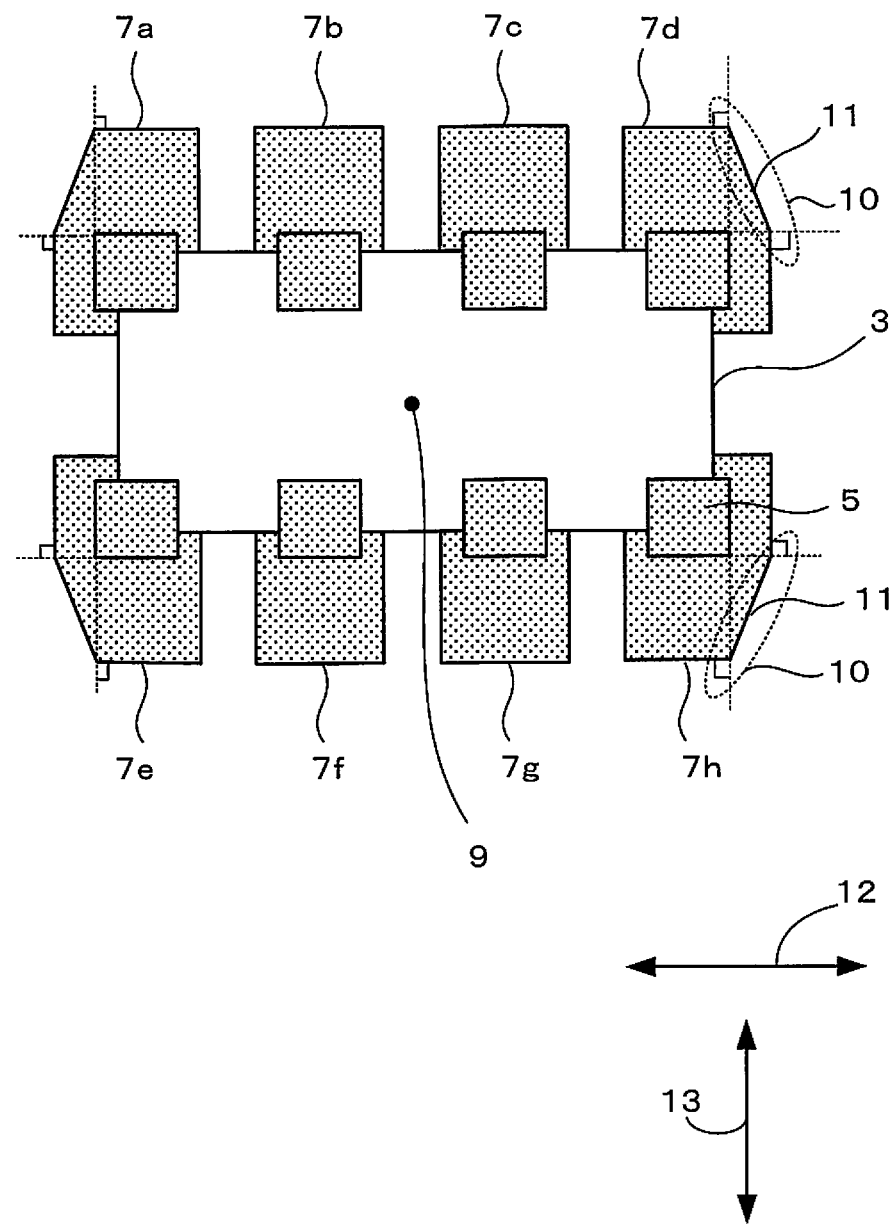
FIG. 3 is a view showing how the outermost pads of FIG. 2 are extended and their corners are cut.

FIG. 3 is a view showing how the outermost pads of FIG. 2 are extended and their corners are cut. "Cutting" here denotes partially removing the pads. Each of the outermost pads 7a, 7d, 7e and 7h has a shape obtained by diagonally cutting a corner or apex portion (see FIG. 2) located farthest from a center 9 of the electronic component 3. Numeral 10 designates a cut portion. A cut line 11 of each of the pads 7a, 7d, 7e and 7h at the both ends is a segment that connects the points of intersection of two sides between which a corner of the electronic component is located and perpendicular lines extending from the corner to the two sides. Further, each of the outermost pads 7*a*, 7*d*, 7*e* and 7*h* may be extended outwardly in a direction 13 perpendicular to a direction 12 of arrangement of the pads, as well as in the direction 12.

Figure 4:
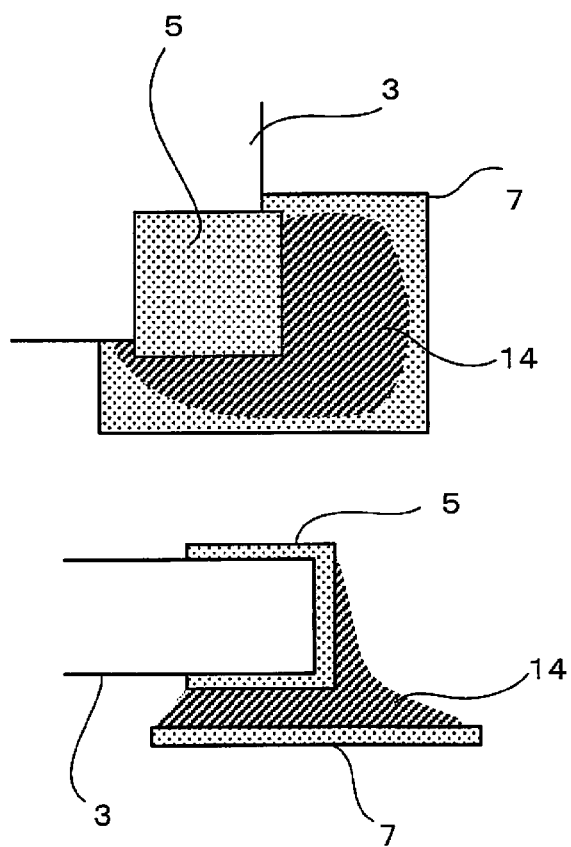
FIG. 4 is a view showing how an outermost pad and an electrode terminal of FIG. 2 are soldered to each other.
Figure 5:
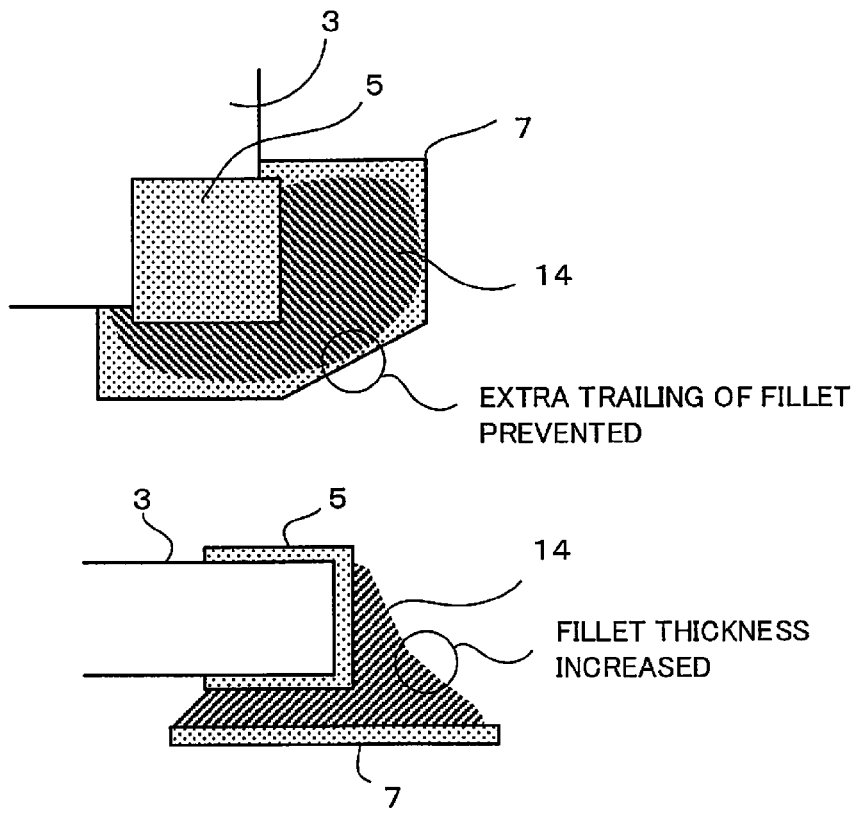
FIG. 5 is a view showing how an outermost pad and an electrode terminal of FIG. 3 are soldered to each other.
Figure 6:
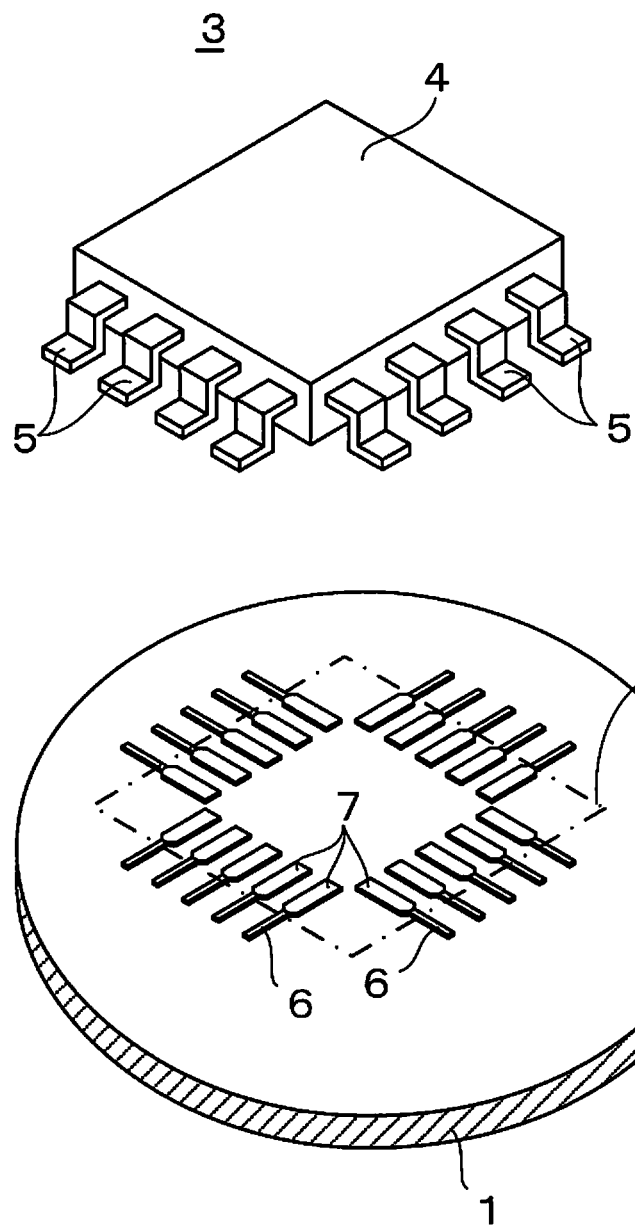
FIG. 6 is a view showing a conventional technique.

FIG. 4 is a view showing how an outermost pad and an electrode terminal of FIG. 2 are soldered to each other. In FIG. 4, numeral 14 designates a solder fillet. FIG. 5 is a view showing how an outermost pad and an electrode terminal of FIG. 3 are soldered to each other. A larger solder fillet can be formed to improve the resistance to temperature cycling by outwardly extending the pad 7 and increasing the solder supply. As shown in FIG. 5, moreover, the solder fillet can be increased in thickness to also improve the temperature cycling resistance by cutting a corner to prevent extra trailing of the solder fillet.

The invention claimed is:

1. A printed wiring board on which an electronic component comprising electrode terminal rows on four peripheral sides or two opposite sides thereof is mounted, the printed wiring board comprising:

pad rows corresponding to the electrode terminal rows; and each of pads at the both ends of the pad rows comprises an extension extending outwardly relative to the other pads not at the both ends of the pad rows, the extension extending outwardly relative to the other pads in the direction of arrangement of the pads from the center of the electronic component, the extension having a shape obtained by diagonally cutting a corner located farthest from the center of the electronic component, wherein one of the pads of the printed wiring board is a corner pad overlapping a corner of the electronic component;

each of the pads at the both ends of the pad rows comprises a solder fillet formed on the pad and on the extension when the electronic component is mounted on the printed wiring board, and the solder fillet formed on the pads and the extension of the pads at the both ends of the pad rows is greater and thicker than a solder fillet formed on the pad not at the both ends of the pad rows, and wherein, in the direction of arrangement of the pads, each of pads at the both ends of the pad rows has a width greater than widths of the other pads not arranged at the both ends of the pad rows.

2. The printed wiring board according to claim 1, wherein each of the pads at the both ends comprises an extension extending outwardly in a direction perpendicular to the direction of arrangement of the pads, as well as in the direction of arrangement of the pads, from the center of the electronic component.

3. The printed wiring board according to claim 1, wherein the extension includes a slanting side.

4. The printed wiring board according to claim 1, wherein the each of the pads at the both ends of the pad rows extends outwardly in a direction perpendicular to the direction of arrangement of the pads from the center of the electronic component.

5. A printed wiring board on which an electronic component comprising electrode terminal rows on four peripheral sides or two opposite sides thereof is mounted, the printed wiring board comprising:

pad rows corresponding to the electrode terminal rows; and each of pads at the both ends of the pad rows comprises an extension extending outwardly relative to the other pads in the direction of arrangement of the pads from the center of the electronic component, the extension having a shape obtained by diagonally cutting a corner located farthest from the center of the electronic component, wherein the electronic component has first and second sides forming a corner of the electronic component, one of the electrode terminals of the electronic component is a corner electrode terminal overlapping said corner of the electronic component, said corner electrode terminal having a third side extending along the first side of the electronic component, a fourth side extending along the second side of the electronic component, and a corner where the third side and the fourth side meet each other, one of the pads of the printed wiring board is a corner pad overlapping both said corner electrode terminal and said corner of the electronic component, said corner pad having a fifth side extending along the first side of the electronic component and the third side of said corner electrode terminal, and a sixth side extending along the second side of the electronic component and the fourth side of said corner electrode terminal, a line, which is an extension of the third side from the corner of said corner electrode terminal, intersects the sixth side at a first intersection, another a line, which is an extension of the fourth side from the corner of said corner electrode terminal, intersects the fifth side at a second intersection, and said corner pad further has a slanting side connecting the first intersection and the second intersection.

6. The printed wiring board according to claim 5, wherein the corner pad is one of the pads at the both ends of the pad rows, and in the direction of arrangement of the pads along the second side of the electronic component, the corner pad has a width greater than widths of the other pads not arranged at the both ends of the pad rows.

* * * * *